United States Patent [19]
Aoki et al.

[11] Patent Number: 5,784,183
[45] Date of Patent: Jul. 21, 1998

[54] SEMICONDUCTOR OPTICAL DEVICE AND METHOD FOR FABRICATING THE SAME

[75] Inventors: Masahiro Aoki, Kokubunji; Tsuyoshi Taniwatari, Hachioji; Makoto Suzuki, Kokubunji; Takayuki Tsutsui, Komoro, all of Japan

[73] Assignee: Hitachi, Ltd., Tokyo, Japan

[21] Appl. No.: 708,302

[22] Filed: Sep. 4, 1996

Related U.S. Application Data

[63] Continuation of Ser. No. 388,507, Feb. 14, 1995, Pat. No. 5,561,682.

[30] Foreign Application Priority Data

Feb. 14, 1994 [JP] Japan .................. 6-017066

[51] Int. Cl.$^6$ ............... H04B 10/00; H04J 14/02
[52] U.S. Cl. ........................ 359/124; 356/163
[58] Field of Search ................ 359/180, 181, 359/188, 124, 133, 163; 372/28, 11, 12, 6, 50

[56] References Cited

U.S. PATENT DOCUMENTS

| | | | |
|---|---|---|---|
| 4,914,607 | 4/1990 | Blonder et al. | 372/44 |
| 5,351,262 | 9/1994 | Poguntke et al. | 372/102 |
| 5,384,797 | 1/1995 | Welch et al. | |
| 5,394,489 | 2/1995 | Koch | 359/181 |
| 5,412,678 | 5/1995 | Treat et al. | |
| 5,465,283 | 11/1995 | Bour et al. | |
| 5,565,693 | 10/1996 | Sasaki et al. | 257/94 |

OTHER PUBLICATIONS

Aoki et al, Novel Structure MQW Electroabsorption Modulator /DFB–Laser Integrated, Electronic Letters vol. 27 No. 23 pp. 2138–2140, Nov. 1991.

Monolithic Integrated Multi–wavelength DFB Laser Arrays and Star Couplers WDM Lightwave Systems by Chung–En Zah and Tien Pei Lee, Prior Art (1).

Lasing Wavelength Control for DBR Lasers Using Selective MOVPE Growth, Prior Art (2).

*Primary Examiner*—Rafael Bacares
*Attorney, Agent, or Firm*—Antonelli, Terry, Stout & Kraus, LLP

[57] ABSTRACT

A semiconductor optical device fabricating method for easily fabricating on a single substrate a plurality of distributed feedback lasers or distributed Bragg reflector lasers with uniform static and dynamic properties and individually different oscillation wavelengths. A plurality of pairs of stripe type insulating thin film masks are formed over that region of the semiconductor substrate which has optical waveguides formed therein for the lasers. Each pair of stripe type masks has a constant gap therebetween. With the masks in place, optical waveguide layers for the lasers are grown in crystallized fashion through metal organic vapor epitaxy. The stripe type masks in pairs differ dimensionally from one another. The semiconductor optical device thus fabricated comprises on one semiconductor substrate a plurality of distributed feedback lasers or distributed Bragg reflector lasers whose optical waveguide layers differ in both film thickness and composition and whose oscillation wavelengths also differ from one another.

19 Claims, 8 Drawing Sheets

SEMICONDUCTOR OPTICAL DEVICE AND METHOD FOR FABRICATING THE SAME

This application is a Continuation of application Ser. No. 08/388,507, filed Feb. 14, 1995, now U.S. Pat. No. 5,561,682.

BACKGROUND OF THE INVENTION

The present invention relates generally to semiconductor optical devices. More particularly, the invention relates to an optical device having a plurality of semiconductor lasers of different output wavelengths formed on a single semiconductor substrate, notably a semiconductor optical device suitable for frequency or wavelength multiplexing data transmission through optical communication modules, optical communication systems or optical communication networks.

Frequency or wavelength multiplexing schemes are actively considered with a view to expanding the transmission capacity of optical communication systems. In particular, efforts are under way for research and development of an integrated array light source having a plurality of single-mode lasers of a different oscillation wavelength each formed on the same substrate. This light source is an important device for use with the frequency or wavelength multiplexing schemes currently contemplated. Conventional multi-wavelength laser arrays reportedly comprise active layers having the same emission peak wavelength and formed of the same crystal growth for all wavelengths. In such setups, electron beam lithography equipment or the like is employed to control the period of the diffraction grating so as to provide any of multiple wavelengths. A report on such a scheme is found in the Optics and Photonics News (O.P.N.), pp. 24–26, March 1993, the Optical Society of America.

The need to utilize the electron beam lithography equipment or the like complicates the above scheme of implementing multi-wavelength laser arrays. Furthermore, attempts to make semiconductor laser characteristics uniform are adversely affected by the fact that the difference between the oscillation wavelength in question and the gain peak wavelength of the active layer (i.e., amount of detuning) varies from one semiconductor laser to another. Reports on these aspects have indicated that although the oscillation wavelength is controlled, increased amounts of detuning lead to significant drops in laser oscillation threshold values and in oscillation efficiency. Also affected adversely are relaxation frequency and spectral line width, which are important factors in the case of rapid modulation. This is one of the problems getting more serious the greater the number of semiconductor lasers (i.e., channel count) formed on a single semiconductor substrate and the wider the range of frequencies or wavelengths used. The problem must be resolved before frequency or wavelength multiplexing transmission can receive widespread acceptance.

There have been reports on a distributed Bragg reflector laser that effects emissions of different wavelengths by use of the diffraction grating of the same period. The emissions are achieved by controlling the layer thickness of the optical waveguide through its selective growth by metal organic vapor epitaxy. One such report was submitted to the 54th Japanese Applied Physics Conference, 27p-H-18, September 1993. With this type of distributed Bragg reflector laser, the active layers are also made of a material having the same gain peak wavelength. The active layer constitution can also lead to the semiconductor laser characteristics getting uneven.

SUMMARY OF THE INVENTION

It is therefore a principal object of the present invention to provide a semiconductor laser device having a plurality of distributed feedback lasers or distributed Bragg reflector lasers integrated on a single substrate, the lasers being uniform in static and dynamic properties and having different oscillation wavelengths.

It is another object of the invention to provide a method for fabricating a semiconductor laser device having a plurality of distributed feedback lasers or distributed Bragg reflector lasers integrated on a single substrate in a very simple manner, the lasers being uniform in static and dynamic properties and having different oscillation wavelengths.

It is a further object of the invention to provide a structure in which optical modulators are applied to monolithically integrated semiconductor optical devices of the above type, as well as a method for fabricating such a structure.

In carrying out the invention and according to one aspect thereof, there is provided a semiconductor optical device comprising on a single substrate a plurality of either distributed feedback lasers or distributed Bragg reflector lasers which have different oscillation wavelengths and which include active layers of different emission peak wavelengths, the oscillation wavelengths of the lasers being arranged to be in the same order in magnitude as the emission peak wavelengths of the active layers thereof.

According to another aspect of the invention, there is provided a semiconductor optical device fabricating method comprising the step of forming a plurality of pairs of stripe type insulating thin film masks so spaced as to let the optical waveguides of semiconductor lasers be formed therebetween. The multiple pairs of insulating thin film masks have different widths for each pair of stripes. Crystals are grown selectively by metal organic vapor epitaxy to deposit an optical waveguide layer and an active layer on a semiconductor substrate over which the insulating thin film masks have been formed. During the above process, before the insulating thin film masks are formed or after the optical waveguide layer is deposited, there is furnished a diffraction grating of the same period at least over that entire region of the semiconductor substrate in which the semiconductor lasers are provided. With the stripes of the insulating thin film masks made different in width, the film thickness of the optical waveguide is controlled, whereby the index of effective refraction of the waveguide and the gain peak wavelength of the active layer are controlled simultaneously.

With the above semiconductor optical device, optical modulators for modulating the output beams of the semiconductor lasers are integrated on the same substrate. The device formation layers such as the optical waveguide layer and active layer wherein the above optical modulators are integrated are fabricated in the same crystal growth process in which the device formation layers of the semiconductor lasers are formed.

FIG. 1A shows typical waveform characteristics of a semiconductor laser such as a distributed feedback laser or distributed Bragg reflector laser with its diffraction grating located close to its optical waveguide layer. FIGS. 1A highlights two major wavelength characteristics: a slowly changing characteristic c1 determined by the composition of the active layer, and a rapidly changing characteristic c2 defined by the composition of the diffraction grating. The emission peak wavelength $\lambda p$ of the active layer having the peak value of the characteristic c1 differs from the oscillation wavelength $\lambda o$ that constitutes the characteristic c2. The difference between the two wavelengths is the amount of detuning d. As mentioned, the larger the amount of detuning d, the greater the drops in laser oscillation threshold values as well as in oscillation efficiencies.

With a wavelength multiplexing semiconductor optical device according to the invention, the oscillation wavelengths ($\lambda o1, \lambda o2, \ldots \lambda on$) of the multiple semiconductor lasers deposited on the same substrate surface are arranged in the same order in magnitude as the emission peak wavelengths ($\lambda p1, \lambda p2, \ldots \lambda pn$) of their active layers, as shown in FIG. 1B. That is, the characteristics are determined so that $\lambda o1 < \lambda o2 < \ldots < \lambda on$ and $\lambda < \lambda p2 < \ldots < \lambda pn$. This makes the amounts of detuning d1, d2, ... dn substantially equal from one semiconductor laser to another. In this manner, the static and dynamic properties of the semiconductor lasers are made uniform without deteriorating their oscillation peak values or their oscillation efficiencies.

A plurality of semiconductor lasers having the above-mentioned wavelength characteristics are fabricated by a simplified semiconductor optical device fabricating method according to the invention. Specifically, an optical waveguide layer and an active layer are grown selectively by metal organic vapor epitaxy on a semiconductor substrate having a diffraction grating of a constant period. Despite the diffraction grating of the same period, the selective growth of the layers causes the index of effective refraction $n_{ef}$ of the optical waveguide layer of each semiconductor laser to vary substantially in proportion to the layer thickness. This makes it possible for a simple crystal growth process easily to fabricate a plurality of semiconductor lasers having different oscillation wavelengths $\lambda pi$ (i=1, 2, ...n)=$2n_{ef}\Lambda(\Lambda$ is the period of the diffraction grating).

Although the multiple semiconductor lasers formed on the same semiconductor substrate serve as a wavelength multiplexing semiconductor optical device, they may alternatively be separated for use as a single-mode semiconductor laser element each. In the alternative case, the inventive semiconductor optical device fabricating method offers a further advantage of fabricating diverse semiconductor laser elements of different oscillation wavelengths at the same time.

The invention may also be applied, along with the same beneficial effects as stated above, to light sources composed of monolithically integrated distributed Bragg reflector lasers and optical modulators as well as to wavelength multiplexing light sources using GaAs.

These and other objects, features and advantages of the invention will become more apparent upon a reading of the following description and appended drawings.

DESCRIPTION OF THE PREFERRED EMBODIMENTS

Preferred embodiments of the invention will now be described with reference to the accompanying drawings.

First Embodiment

Figure 1A:
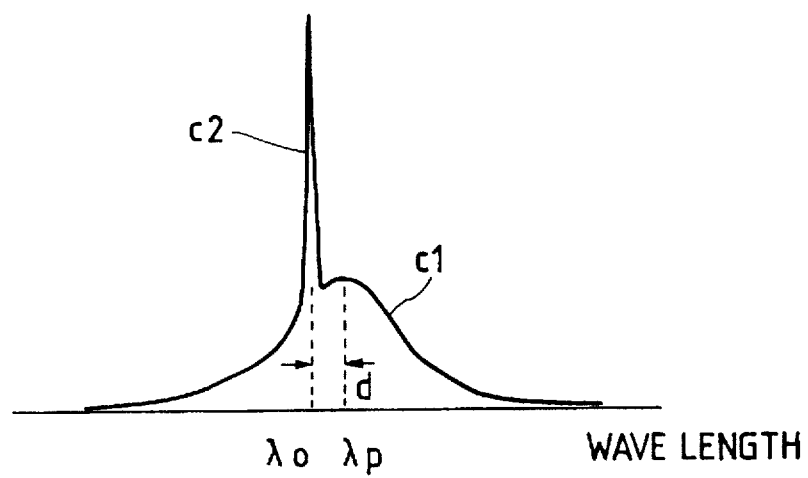
FIGS. 1A and 1B are views of wavelength characteristics for explaining how the invention works.
Figure 1B:
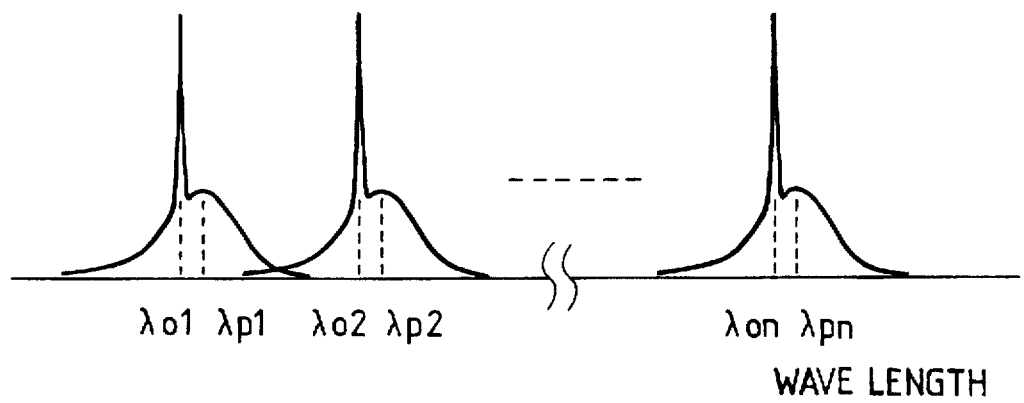
Figure 2A:
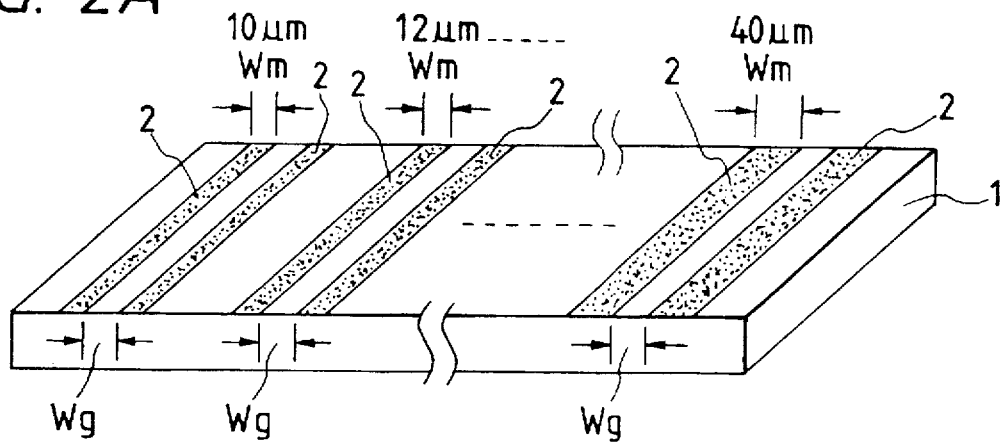
FIGS. 2A, 2B and 2C are perspective views showing processes of a semiconductor optical device fabricating method practiced as a first embodiment of the invention.
Figure 2B:
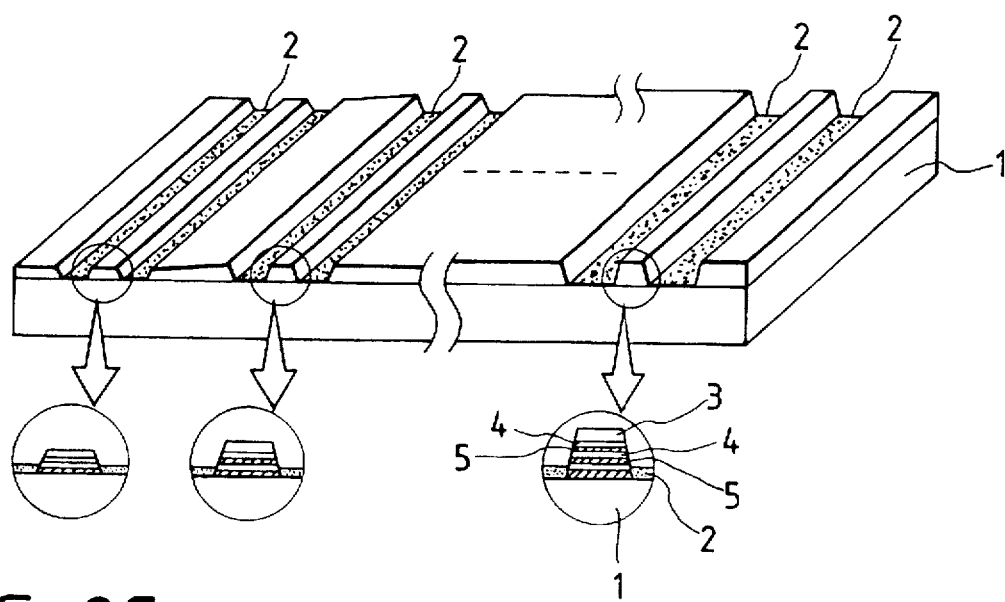
Figure 2C:
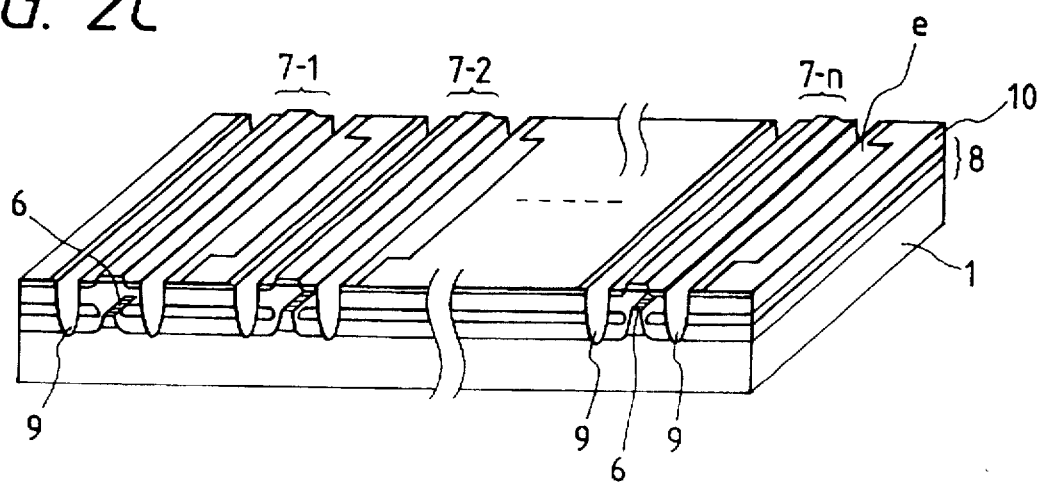

FIGS. 2A, 2B and 2C are perspective views showing typical processes of a semiconductor optical device fabricating method practiced as the first embodiment of the invention. As shown in FIG. 2A, insulating thin film masks 2 are first formed on an InP semiconductor substrate 1. The pattern of the insulating thin film 2 is composed of pairs of $SiO_2$ stripes arranged in parallel. The gap Wg between the two $SiO_2$ stripes of each pair is 10 μm, and the mask width Wm varies from 10 μm to 40 μm at intervals of 2 μm. Over the substrate 1 comprising the masks 2, the metal organic vapor epitaxy method is used to grow selectively a multiple quantum well (MQW) structure of 10 periods. The MQW structure comprises an optical waveguide layer 3 of InGaAsP (composition wavelength: 1.30 μm) with a thickness of 0.2 μm, a well layer 4 of InGaAsP (composition wavelength: 1.60 μm) with a thickness of 6 nm, and a barrier layer 5 of InGaAsP (composition wavelength: 1.30 μm) with a thickness of 8 nm. The selective growth forms the optical waveguide layer 3, well layer 4 and barrier layer 5 in the gap Wg between the masks of each pair. The thicknesses of these layers and their composition varies with the widths Wm of the masks 2, as shown magnified in the circled portions of FIG. 2B.

Then as shown in FIG. 2C, a diffraction grating 6 with a period of 240 nm is formed by a known method over the entire surface of the substrate, i.e., on the top of the optical waveguide layer 3 of FIG. 2B. After this, a current block layer 8 and a cladding layer 10 are provided, followed by grooves 9 for separation purposes. Electrodes e are furnished where appropriate. The processes above combine to fabricate a plurality of distributed feedback lasers 7-1, 7-2, ... 7-7n in array constituting a buried heterostructure and having different oscillation wavelengths.

Figure 3A:
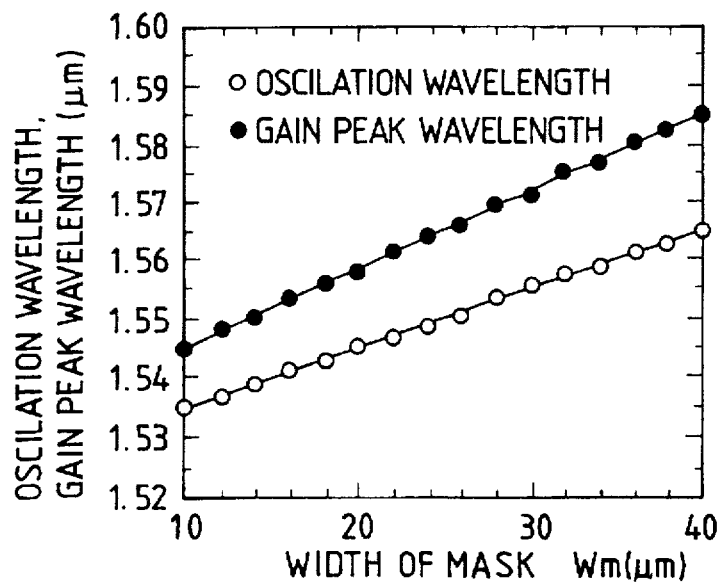
FIGS. 3A, 3B and 3C are graphic representations showing measured characteristics of a semiconductor optical device fabricated by the method of the first embodiment.

FIG. 3A graphically shows measured characteristics indicating how the oscillation wavelengths and gain peak wavelengths of a plurality of distributed feedback lasers vary depending on their mask widths Wm, the lasers being fabricated by the above inventive method. As shown in FIG. 3A, when the width Wm of the masks 2 was increased from 10 μm to 40 μm at intervals of 2 μ, the oscillation wavelength (indicated by hollow circles) and the gain peak wavelength (indicated by solid circles) got longer correspondingly. The oscillation wavelength varied from 1535 nm to 1565 nm at approximate intervals of 2 nm, whereas the gain peak wavelength varied from 1545 nm to 1585 nm. The increase in the oscillation wavelength is attributable to the fact that the optical waveguide layer 3, well layer 4 and barrier layer 5 grew thicker through selective growth, thus boosting the index of effective refraction $n_{eff}$ of the optical waveguide; the increase in the gain peak wavelength is attributable to the fact that the well layer 4 grew thicker, thereby reducing the quantum level energy. From the characteristics in FIG. 3A, it can be seen that the difference between oscillation wavelength and gain peak wavelength, i.e., the amount of detuning ranges from −20 nm to −10 nm, which is a significantly limited dispersion for all mask widths Wm.

Figure 3B:
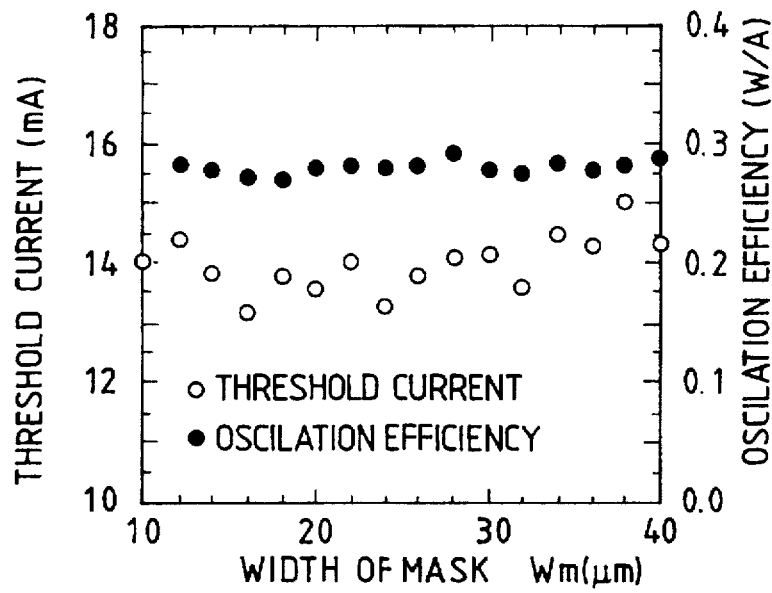

FIG. 3B is a graphic representation of measured characteristics indicating how the threshold currents and oscillation efficiencies of the above-mentioned distributed feedback lasers vary depending on their mask widths Wm. With only the limited dispersion detected in the amounts of detuning between the lasers, the threshold currents are substantially uniform between 13 and 15 mA for all channels, and so are the oscillation efficiencies between 0.27 and 0.3 W/A for all channels.

Figure 3C:
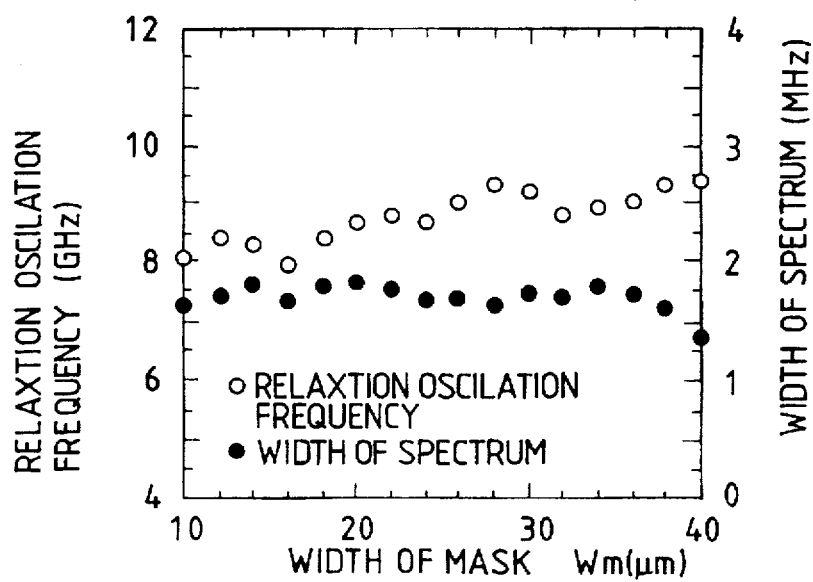

FIG. 3C is another graphic representation of measured characteristics showing how the relaxation frequencies and spectral line widths of the above-mentioned distributed feedback lasers vary depending on their mask widths Wm. As illustrated, the measurements of the relaxation frequencies and spectral line widths are also seen to be uniform substantially.

Second Embodiment

Figure 4A:
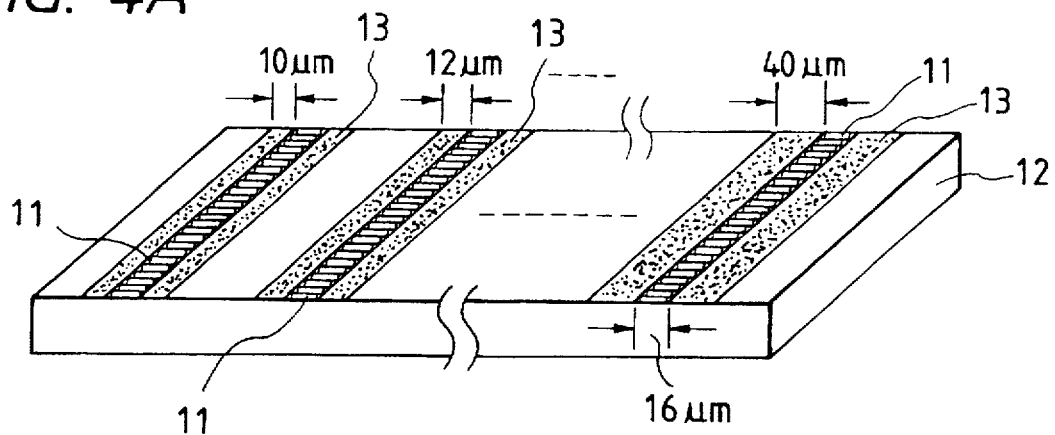
FIGS. 4A, 4B and 4C are perspective views depicting processes of a semiconductor optical device fabricating method practiced as a second embodiment of the invention.
Figure 4B:
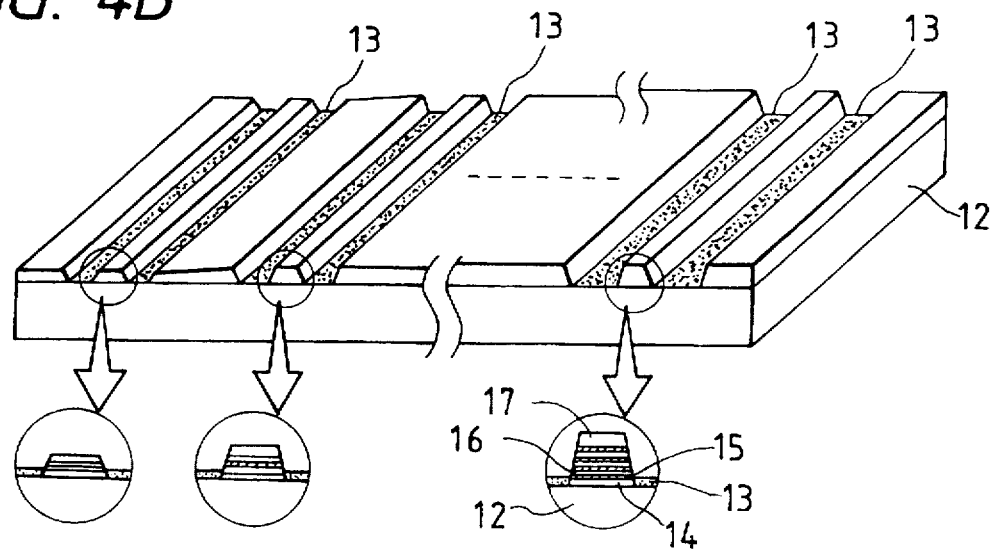
Figure 4C:
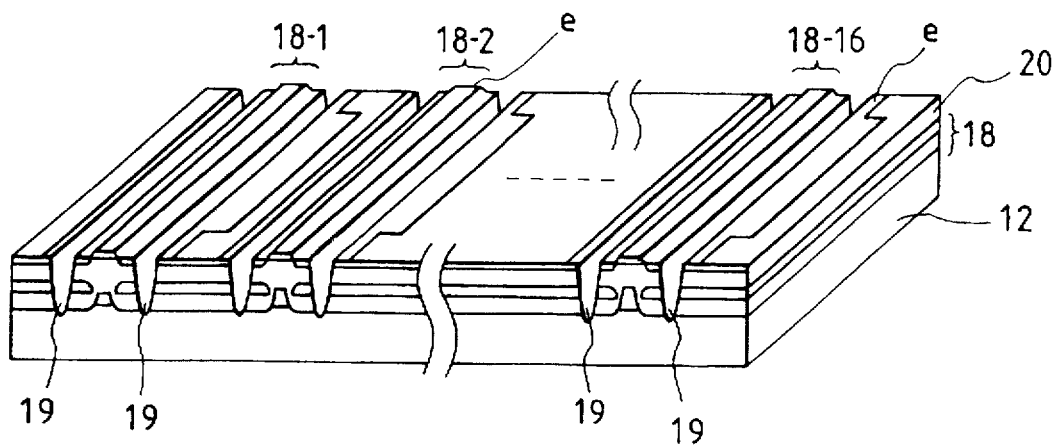

FIGS. 4A, 4B and 4C are perspective views depicting typical processes of a method for fabricating a wavelength multiplexing light emitting device, the method being practiced as the second embodiment of the invention. The method of the second embodiment is basically the same as that of the first embodiment except that the metal organic vapor epitaxy method is used to grow selectively an optical waveguide layer and an active layer on a substrate over which a diffraction grating has been formed. Referring to FIG. 4A, SiO$_2$ masks 13 are formed by a known method on a (100)n-InP substrate 12 over which a diffraction grating 11 having a constant period of 240 nm has been furnished. The masks 13 are composed of 16 pairs of stripes. The mask widths Wm vary from 10 to 40 μm in 16 steps at intervals of 2 μm. The gap between the two stripes of each pair is constant at 16 μm.

Then as shown in FIG. 4B, the metal organic vapor epitaxy method is used to grow a multiple quantum well (MQW) structure of five periods (three in the figure) as well as a p-type InP cladding layer 17. The MQW structure comprises an optical waveguide layer 14 of InGaAsP (composition wavelength: 1.30 μm) with a thickness of 0.2 μm, a well layer 15 of InGaAsP (composition wavelength: 1.60 μm) with a thickness of 6 nm, and a barrier layer 16 of InGaAsP (composition wavelength: 1.15 μm) with a thickness of 8 nm.

Thereafter, as shown in FIG. 4C, a current block layer 18 and a cladding layer 20 are formed by a known method, followed by grooves 19 for separation purposes. Electrodes e are furnished where appropriate. These processes combine to fabricate a plurality of distributed feedback lasers 18-1, 18-2, ... 18-16 in array constituting a buried heterostructure on the same substrate.

When measured in experiments, the array of 16 distributed feedback lasers 18-1, 18-2, ... 18-16 had their oscillation wavelengths varied between 1542 nm and 1560 nm at approximate intervals of 1.2 nm. The gain wavelengths of these lasers were between 1545 nm and 1575 nm. Thus the amount of detuning ranged from −15 nm to −3 nm for all widths Wm. With only the limited dispersion detected in the amounts of detuning between the lasers, the threshold currents were substantially uniform between 13 and 15 mA for all channels, and so were the oscillation efficiencies between 0.27 and 0.3 W/A for all channels. Likewise the relaxation frequencies and spectral line widths of the lasers were made uniform as well. With the device thus fabricated, each of the individual lasers on the 16 channels was modulated at 2.5 gigabits per second, whereby the modulation of 40 gigabits per second was accomplished.

Third Embodiment

Figure 5A:
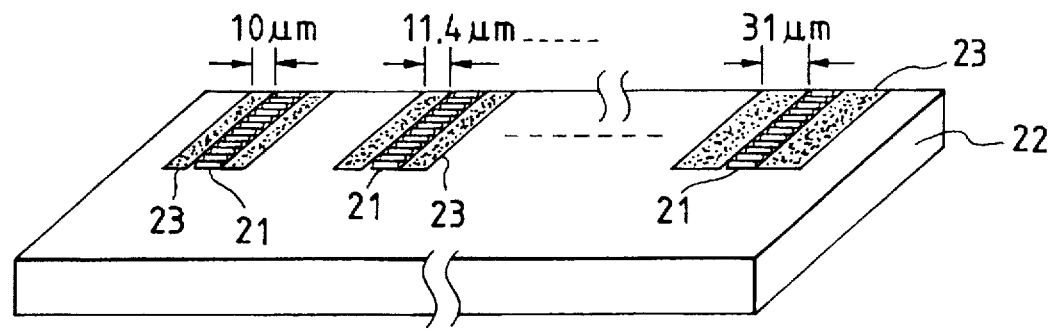
FIGS. 5A, 5B and 5C are perspective views indicating processes of a semiconductor optical device fabricating method practiced as a third embodiment of the invention.
Figure 5B:
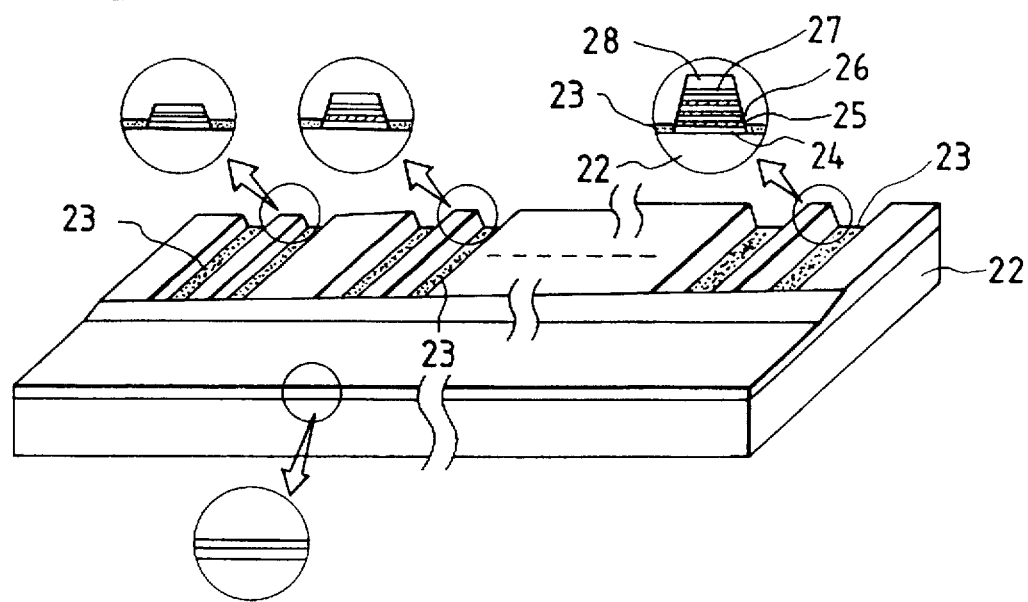
Figure 5C:
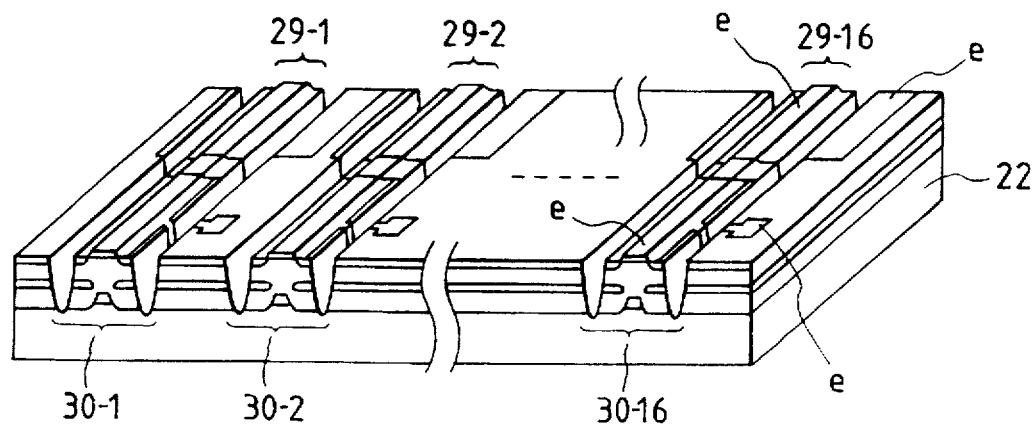

FIGS. 5A, 5B and 5C are perspective views indicating typical processes of a method for fabricating a wavelength multiplexing light emitting device, the method being practiced as the third embodiment of the invention. The device thus fabricated is an assembly of a plurality of semiconductor lasers each coupled with an optical modulator, the whole components being formed integrally on the same semiconductor substrate.

As shown in FIG. 5A, over a (100)n-InP substrate 22 partially comprising a diffraction grating 21 with a constant period of 239.5 nm, SiO$_2$ masks 23 are formed by a known method on both sides of each region in which one bar of the grating 21 is provided. The masks 23 are composed of 16 pairs of stripes. The mask widths Wm range from 10 to 31 μm in 16 steps at intervals of 1.4 μm. The gap between the two stripes of each pair is constant at 16 μm.

Then as depicted in FIG. 5B, the metal organic vapor epitaxy method is used to grow a multiple quantum well (MQW) structure of seven periods (three in the figure). The MQW structure comprises a lower optical waveguide layer 24 of InGaAsP (composition wavelength: 1.30 μm) with a thickness of 0.15 μm, a well layer 25 of InGaAs (whose lattice constant is 0.3% shorter than that of InP) with a thickness of 6.5 nm, and a barrier layer 26 of InGaAsP (composition wavelength: 1.15 μm) with a thickness of 8 nm. On the above MQW structure, an upper optical waveguide layer 27 of InGaAsP (composition wavelength: 1.30 μm) with a thickness of 0.05 μm and a p-type InP cladding layer 28 are also grown by the same method.

Thereafter, as shown in FIG. 5C, a current block layer, a cladding layer and grooves are formed by a known method. Electrodes e are furnished where appropriate. These processes combine to fabricate integrally a plurality of distributed feedback lasers 29-1, 29-2, ... 29-16 in a buried heterostructure as well as a plurality of optical modulators 30-1, 30-2, ... 30-16 also in a buried heterostructure.

When thus fabricated by the method of the third embodiment, the wavelength multiplexing light emitting device had its oscillation wavelength and gain peak wavelength get longer as the width Wm of the masks 23 became wider. Specifically, the oscillation wavelengths of the 16 distributed feedback lasers 29-1, 29-2, ... 29-16 were between 1549 nm and 1561 nm varying at approximate intervals of 0.8 nm, and the gain peak wavelengths of these lasers were between 1545 nm and 1570 nm. Thus the amount of detuning ranged from −9 nm to +4 nm for all widths Wm. With only the limited dispersion detected in the amounts of detuning between the lasers, the threshold currents were substantially uniform between 14 and 15 mA for all channels, and so were the oscillation efficiencies between 0.12 and 0.13 W/A for all channels. Furthermore, the structures of the distributed feedback lasers 29-1, 29-2, ... 29-16 and of the optical modulators 30-1, 30-2, ... 30-16 were fabricated by the same crystal growth process. With the device fabricated by the method of the third embodiment, the 16 optical modulator integrated distributed feedback lasers were each modulated at 10 gigabits per second, whereby the modulation of 160 gigabits per second was accomplished.

Fourth Embodiment

Figure 6A:
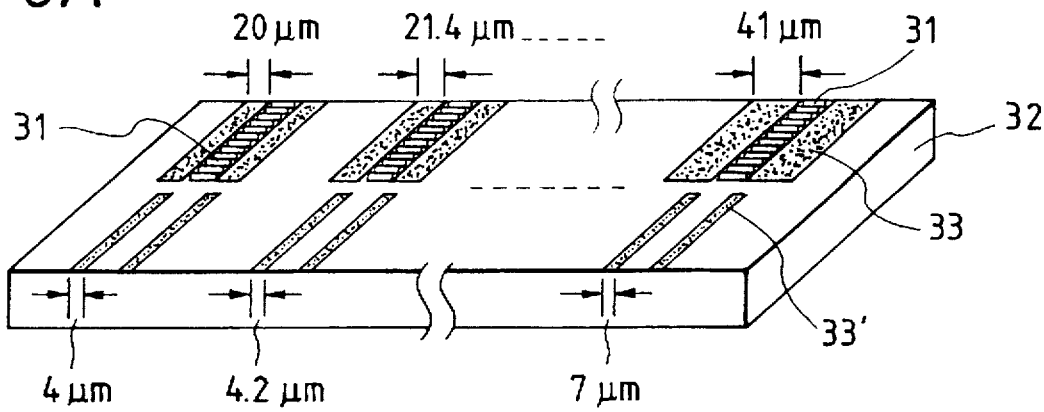
FIGS. 6A, 6B and 6C are perspective views showing processes of a semiconductor optical device fabricating method practiced as a fourth embodiment of the invention.
Figure 6B:
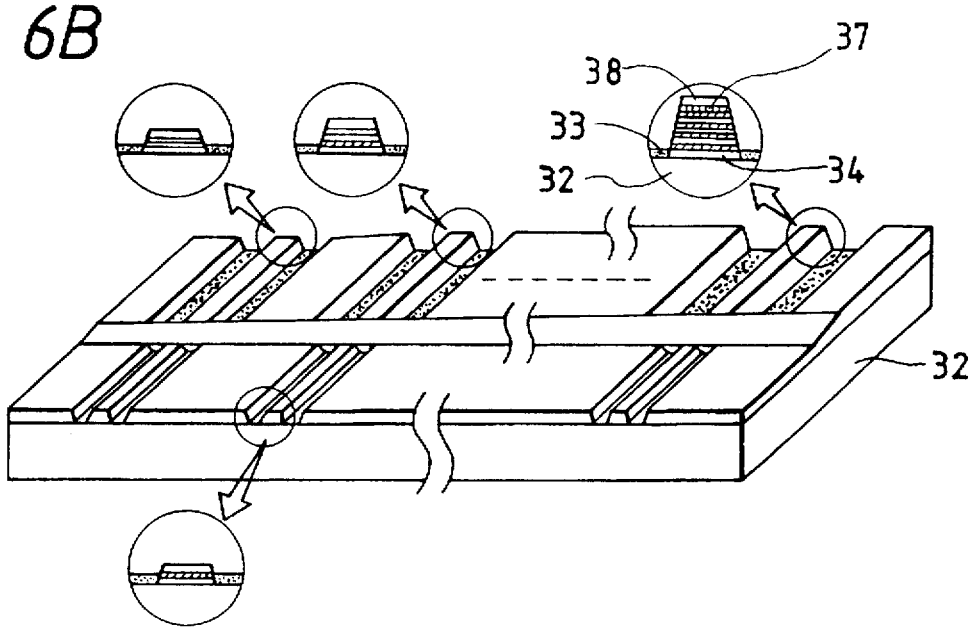
Figure 6C:
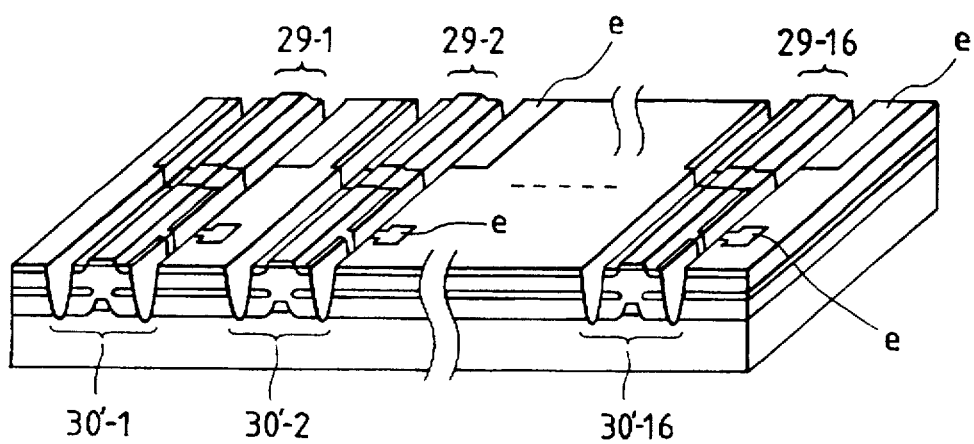

FIGS. 6A, 6B and 6C are perspective views showing typical processes of a method for fabricating a wavelength multiplexing light emitting device, the method being practiced as the fourth embodiment of the invention. A variation of the third embodiment, the fourth embodiment allows the optical modulators to be fabricated by selective growth as well.

As shown in FIG. 6A, on a (100)n-InP substrate 32 partially comprising a diffraction grating 31 with a constant period of 239.5 nm, $SiO_2$ masks 33 are formed by a known method on both sides of each region in which one bar of the grating 31 is provided. The masks 33 are composed of 16 pairs of stripes. The mask widths Wm range from 20 to 41 μm in 16 steps at intervals of 1.4 μm. The gap between the two stripes of each pair is constant at 16 μm. Masks 33' are then formed over the region where the diffraction grating 31 is not provided. The masks 33' are also composed of 16 pairs of stripes. The widths Wm of these masks 33' range from 4 to 7 μm in 16 steps at intervals of 0.2 μm. The gap between the two stripes of each pair is constant at 10 μm.

Then as indicated in FIG. 6B, the metal organic vapor epitaxy method is used to grow a multiple quantum well (MQW) structure of seven periods (three in the figure). The MQW structure comprises a lower optical waveguide layer 34 of InGaAsP (composition wavelength: 1.30 μm) with a thickness of 0.12 μm, a well layer 35 of InGaAs (whose lattice constant is 0.4% shorter than that of InP) with a thickness of 5.8 nm, and a barrier layer 36 of InGaAsP (composition wavelength: 1.15 μm) with a thickness of 7 nm. On the above MQW structure, an upper optical waveguide layer 37 of InGaAsP (composition wavelength: 1.30 μm) with a thickness of 0.04 μm and a p-type InP cladding layer 38 are also grown by the same method.

Thereafter, as shown in FIG. 6C, a plurality of distributed feedback lasers 29-1, 29-2, ... 29-16 in a buried heterostructure as well as a plurality of optical modulators 30'-1, 30'-2, ... 30'-16 also in a buried heterostructure are fabricated integrally by a known method. When measured in experiments, the device fabricated by the method of the fourth embodiment had its oscillation wavelength and gain peak wavelength get longer as the mask width Wm became wider. Specifically, the oscillation wavelengths of the 16 distributed feedback lasers 29-1, 29-2, ... 29-16 were between 1549 nm and 1561 nm varying at approximate intervals of 0.8 nm, and the gain peak wavelengths of these lasers were between 1545 nm and 1570 nm. Thus the amount of detuning ranged from −9 nm to +4 nm for all widths Wm. With only the limited dispersion detected in the amounts of detuning between the lasers 29-1, 29-2, ... 29-16, the threshold currents were substantially uniform between 14 and 15 mA for all channels, and so were the oscillation efficiencies between 0.12 and 0.13 W/A for all channels. With the device fabricated by the method of the fourth embodiment, the absorption wavelengths of the optical modulators 30'-1, 30'-2, ... 30'-16 were found to vary between 1495 nm and 1507 nm at approximate intervals of 0.8 nm under the influence of the selectively grown masks 33' over these modulators. As a result, the amount of detuning between the oscillation of each laser and the absorption wavelength of each optical modulator remained substantially constant at 50 nm. Given such a constant amount of detuning, the driving voltages and line width growth factors of the modulators were also made uniform.

With the device thus fabricated, the 16 optical modulator integrated distributed feedback lasers (constituting 16 channels) were each modulated at 10 gigabits per second, whereby the modulation of 160 gigabits per second was accomplished.

Fifth Embodiment

Figure 7:
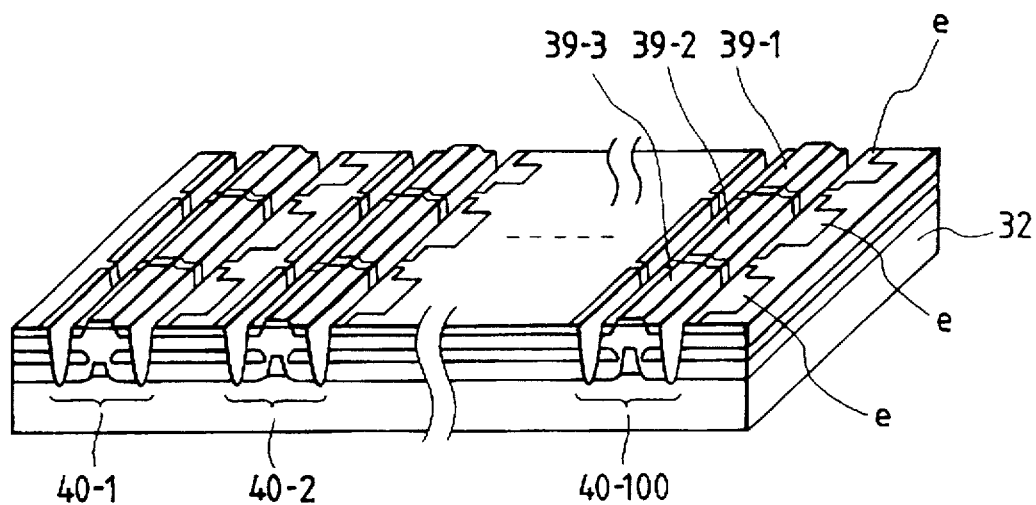
FIG. 7 is a perspective view depicting the constitution of a semiconductor optical device practiced as a fifth embodiment of the invention.

FIG. 7 is a perspective view depicting the constitution of a wavelength multiplexing light emitting device practiced as the fifth embodiment of the invention. The device is fabricated by a method approximately the same as that of the second embodiment. The fifth embodiment is composed of 100 channels representing three-electrode phase shift distributed feedback lasers 40 (40-1, 40-2, ... 40-100) which are formed on a single substrate 32 and which have an average wavelength spacing of 0.32 nm therebetween. The three-electrode phase shift distributed feedback (DFB) laser 40 is a wavelength variable laser whose upper electrode is divided into three individual electrodes 39-1, 39-2 and 39-3. In operation, the oscillation wavelength of the laser is tuned by varying the ratio of inrush currents to the electrodes 39-1, 39-2 and 39-3. In experiments where all channels of the fifth embodiment were frequency-modulated at 10 gigabits per second, the modulation of 1 terabits per second was accomplished.

Sixth Embodiment

Figure 8A:
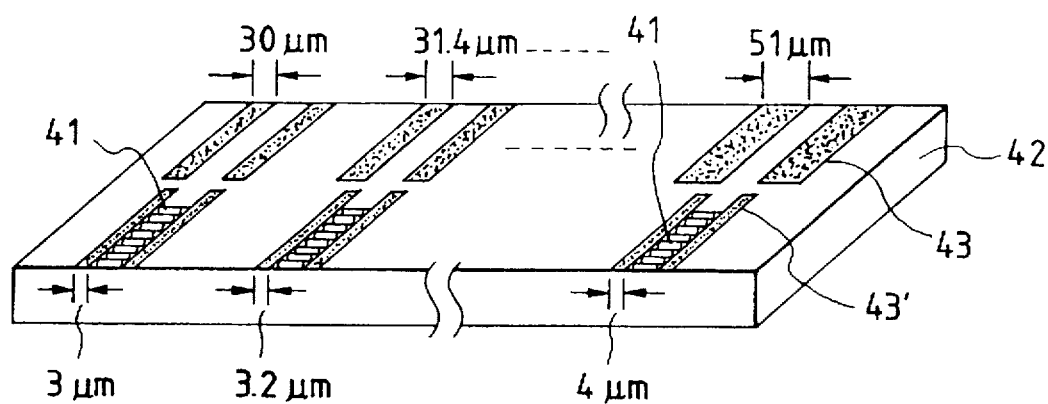
FIGS. 8A, 8B and 8C are perspective views indicating processes of a method for fabricating a wavelength multiplexing light emitting device, the method being practiced as a sixth embodiment of the invention.
Figure 8B:
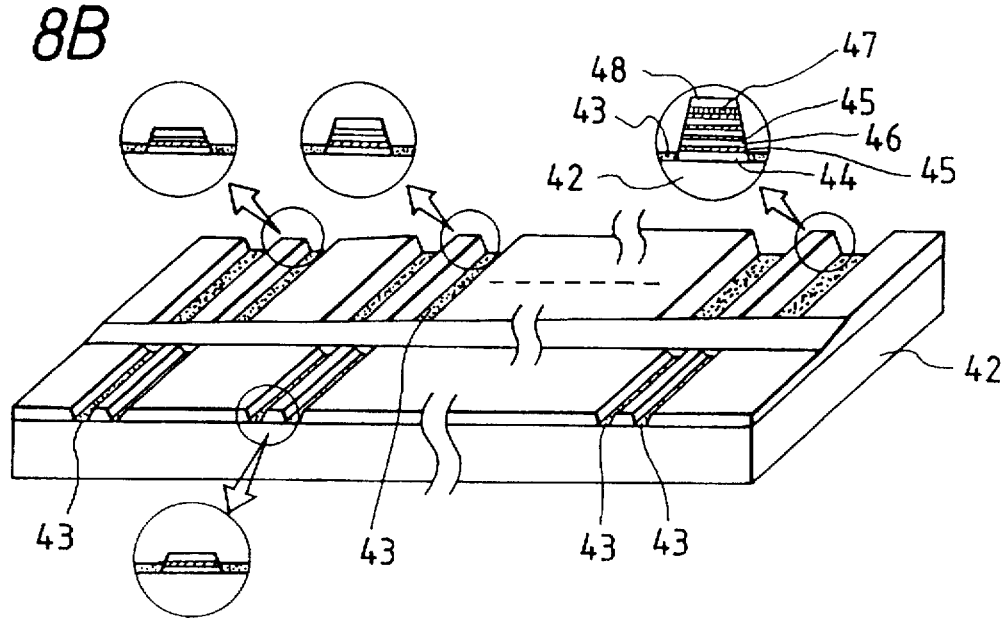
Figure 8C:
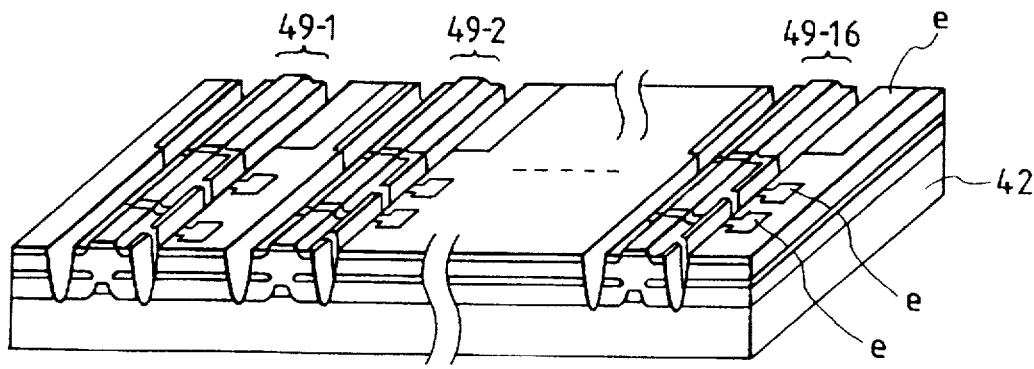

FIGS. 8A, 8B and 8C are perspective views indicating typical processes of a method for fabricating a wavelength multiplexing light emitting device, the method being practiced as the sixth embodiment of the invention. As shown in FIG. 8A, the sixth embodiment involves having $SiO_2$ masks 43 and 43' formed conventionally on a (100)n-InP substrate 42 on which a diffraction grating 41 with a constant period of 239.5 nm has been partially provided. Over the region where the diffraction grating 41 exists, the masks 43' are formed of 16 pairs of stripes. The widths Wm of the masks 43' range from 3 to 6 μm in 16 steps at intervals of 0.2 μm. The gap between the two stripes of each pair is constant at 16 μm. Over the region where the diffraction grating 41 does not exist, the masks 43 are formed of 16 pairs of stripes. The widths Wm of the masks 43 range from 30 to 51 μm in 16 steps at intervals of 1.4 μm. The gap between the two stripes of each pair is constant at 10 μm.

Then as depicted in FIG. 8B, the metal organic vapor epitaxy method is used to grow a multiple quantum well (MQW) structure of seven periods (three in the figure). The MQW structure comprises a lower optical waveguide layer 44 of InGaAsP (composition wavelength: 1.30 μm) with a thickness of 0.12 μm, a well layer 45 of InGaAs (whose lattice constant is 0.4% shorter than that of InP) with a thickness of 3.6 nm, and a barrier layer 46 of InGaAsP (composition wavelength: 1.15μpm) with a thickness of 7 nm. On the above MQW structure, an upper optical waveguide layer 47 of InGaAsP (composition wavelength: 1.30 μm) with a thickness of 0.04 μm and a p-type InP cladding layer 48 are also grown by the same method.

Thereafter, as shown in FIG. 8C, a plurality of distributed feedback lasers 49-1, 49-2, ... 49-16 in a buried heterostructure are fabricated by a known method. When measured in experiments, the device fabricated by the method of the sixth embodiment had its oscillation wavelength and gain peak wavelength of the active layer get longer as the mask width Wm became wider. Specifically, the oscillation wavelengths of the 16 channels of the distributed feedback lasers were between 1546 nm and 1558 nm varying at approximate intervals of 0.8 nm, and the gain peak wavelengths of these channels were between 1550 nm and 1562 nm. Thus the amount of detuning was made even at about −4 nm for all mask widths Wm. With little dispersion detected in the amounts of detuning between the lasers, the threshold currents were substantially uniform between 14 and 15 mA for all channels, and so were the oscillation efficiencies between 0.30 and 0.32 W/A for all channels. With the device thus fabricated, the currents flowing to different regions were controlled by a known method so that each channel was adjusted to an oscillation wavelength of 2 nm. When the 16 channels were subjected individually to wavelength sweep, the device fabricated by the sixth embodiment permitted wavelength sweep of up to 12 nm.

Seventh Embodiment

Figure 9:
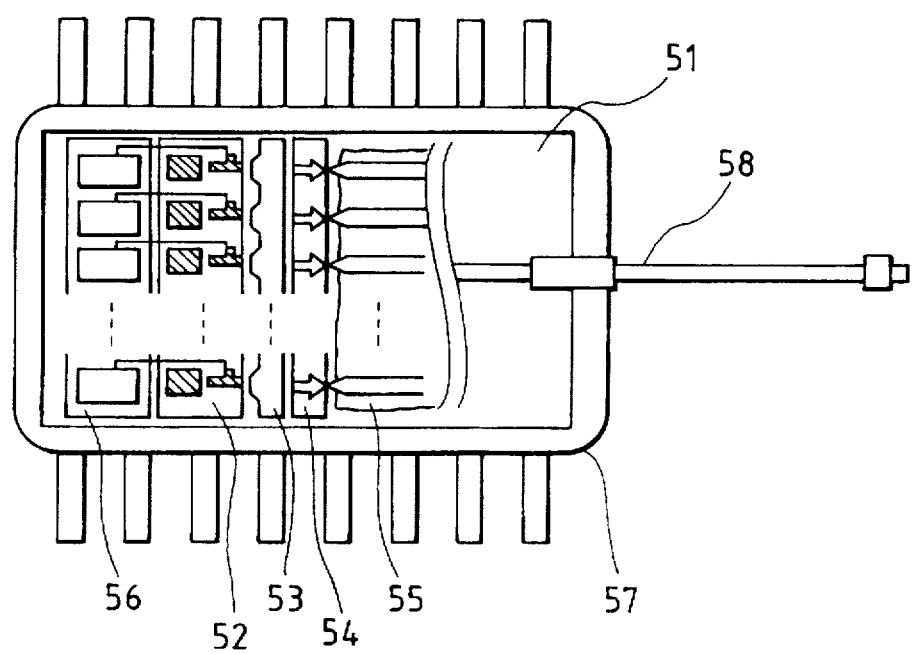
FIG. 9 is a plan view of a wavelength multiplexed transmitter module comprising a wavelength multiplexing light emitting device according to the invention, the transmitter module being practiced as a seventh embodiment of the invention.

FIG. 9 is a plan view of a wavelength multiplexed transmitter module comprising a semiconductor optical device according to the invention, the transmitter module being practiced as the seventh embodiment of the invention. The seventh embodiment is a wavelength multiplexed transmitter module 57 comprising a sub-mount 51 that carries diverse components. On the sub-mount 51, there are fixedly provided a monolithically integrated semiconductor optical device as a light source 52, an isolator array 54 comprising non-spherical lenses aligned optically with each of the semiconductor laser elements, a lens array 53 interposed between the light source 52 and the isolator array 54, and a lensed fiber array 55. A modulation driver array 56 is incorporated in the sub-mount 51. On the opposite side of the isolator array 54, the lensed fiber array 55 has its terminals connected to an optical transmission line 58 via a multiplexer, not shown. Using this module 57 makes it possible easily and economically to generate light signals for low-chirping high-speed data transmission at 40 to 160 gigabits per second.

As described and according to the invention, distributed feedback lasers or distributed Bragg reflector lasers having uniform static and dynamic properties and different oscillation wavelengths can be fabricated integrally on the same substrate in a very simple manner. The invention dramatically enhances the performance and yield of semiconductor optical devices. In addition, such semiconductor optical devices fabricated according to the invention may be applied to optical communication systems whose capacities and communication distances are easily increased thereby.

What is claimed is:

1. An optical communication system, comprising:
   a plurality of light sources, the wavelengths of light signals emitted by said light sources being different from each other, wherein oscillation wavelengths of said plurality of light sources are arranged in the same order in magnitude as emission peak wavelengths of said plurality of light sources.
   a plurality of optical modulators for modulating said light signals by driving voltages applied thereto, each of said optical modulation being optically connected to a respective one of said light sources; and
   a multiplexer for multiplexing all of said light signals modulated by said optical modulators into an optical transmission line.

2. An optical communication system according to claim 1, wherein said light sources are arranged in parallel and said optical modulators are arranged in parallel.

3. An optical communication system according to claim 1, further including a plurality of modulation drivers, each of said modulation drivers applying a driving voltage to a respective one of said optical modulators and being arranged in the opposite side of each of said light sources to said multiplexer.

4. An optical communication system according to claim 2, wherein said modulation drivers are arranged in parallel.

5. An optical communication system, comprising:
   a plurality of lasers arranged in parallel for generating light signals, wherein said plurality of lasers have different oscillation wavelengths and different emission peak wavelengths and the oscillation wavelengths of said plurality of lasers are arranged in the same order in magnitude as emission peak wavelengths of said plurality of lasers;
   a plurality of optical modulators arranged in parallel and having a respective driving voltage applied thereto for modulating said light signal from each of said lasers, respectively;
   an optical fiber array, in which a plurality of terminals of optical fibers are fixed so that each of said terminals receives a light signal modulated by each of said optical modulators; and
   a modulation driver array having a plurality of modulation drivers, each of said modulation drivers applying a driving voltage to a respective one said optical modulators.

6. An optical communication system according to claim 5, wherein said optical fiber array transmits said light signals to an optical transmission line via a multiplexer.

7. An optical communication system according to claim 5, wherein said modulation driver array is disposed on the opposite side of said plurality of lasers to said optical fiber array.

8. An optical communication system, comprising:
   a plurality of light sources, the wavelengths of light signals emitted by said light sources being different from each other, wherein oscillation wavelengths of said light sources are arranged in the same order in magnitude as emission peak wavelengths of said light sources, and wherein amounts of detuning of said light sources are substantially equal from one light source to another light source;
   a plurality of optical modulators for modulating said light signals by driving voltages applied thereto, each of said optical modulation being optically connected to a respective one of said light sources; and
   a multiplexer for multiplexing all of said light signals modulated by said optical modulators into an optical transmission line.

9. An optical communication system according to claim 8, wherein said light sources are arranged in parallel and said optical modulators are arranged in parallel.

10. An optical communication system according to claim 8, further including a plurality of modulation drivers, each of said modulation drivers applying a driving voltage to a respective one of said optical modulators and being arranged in the opposite side of each of said light sources to said multiplexer.

11. An optical communication system, comprising:
    a plurality of lasers arranged in parallel for generating light signals;
    a plurality of optical modulators for modulating said light signal from each of said lasers, respectively;
    an optical fiber array, in which a plurality of terminals of optical fibers are fixed so that each of said terminals receives a light signal modulated by each of said optical modulators;
    wherein amounts of detuning of said optical modulators are substantially equal from one optical modulator to another optical modulator.

12. An optical communication system according to claim 11, wherein amounts of detuning between oscillation wavelengths of respective ones of said plurality of lasers and absorption wavelengths of associated ones of said plurality of optical modulators are substantially equal.

13. An optical communication system according to claim 11, wherein said optical fiber array transmits said light signals to an optical transmission line via a multiplexer.

14. An optical communication system according to claim 11, wherein said modulation driver array is disposed on the opposite side of said plurality of lasers of said optical fiber array.

15. An optical communication system, comprising:

a plurality of light sources, the wavelength of light signals emitted by said light sources being different from each other, wherein oscillation wavelengths of said light sources are arranged in the same order in magnitude as emission peak wavelengths of said light sources;

a plurality of optical modulators for modulating said light signals by driving voltages applied thereto, each of said optical modulation being optically connected to a respective one of said light sources, wherein amounts of detuning of said optical modulators are substantially equal from one optical modulator to another optical modulator; and a multiplexer for multiplexing all of said light signals modulated by said optical modulators into an optical transmission line.

16. An optical communication system according to claim 15, wherein said light sources are arranged in parallel and said optical modulators are arranged in parallel.

17. An optical communication system according to claim 15, further including a plurality of modulation drivers, each of said modulation drivers applying a driving voltage to a respective one of said optical modulators and being arranged in the opposite side of each of said light sources to said multiplexer.

18. An optical communication system according to claim 17, wherein said modulation drivers are arranged in parallel.

19. An optical communication system according to claim 15, wherein amounts of detuning between the oscillation wavelengths of respective ones of said plurality of light sources and absorption wavelengths of associated ones of said plurality of optical modulators are substantially equal.

* * * * *